(12) United States Patent
Parris et al.

(10) Patent No.: US 7,463,054 B1
(45) Date of Patent: Dec. 9, 2008

(54) DATA BUS CHARGE-SHARING TECHNIQUE FOR INTEGRATED CIRCUIT DEVICES

(75) Inventors: Michael C. Parris, Colorado Springs, CO (US); Kim C. Hardee, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 0 days.

(21) Appl. No.: 11/854,422

(22) Filed: Sep. 12, 2007

(51) Int. Cl.
*H03K 19/003* (2006.01)

(52) U.S. Cl. .............................. 326/31; 326/34; 326/86

(58) Field of Classification Search .................. 326/21, 326/31, 33–34, 82–83, 86–87; 327/108–109; 365/203–208
See application file for complete search history.

(56) References Cited

U.S. PATENT DOCUMENTS

| | | | | |
|---|---|---|---|---|
| 6,115,316 A * | 9/2000 | Mori et al. | ............ | 365/230.03 |
| 6,259,322 B1 * | 7/2001 | Muza | ......................... | 330/257 |
| 6,347,058 B1 * | 2/2002 | Houghton et al. | ........... | 365/203 |
| 6,487,133 B2 * | 11/2002 | Wada et al. | .................. | 365/205 |
| 6,754,122 B2 * | 6/2004 | Wada et al. | ................. | 365/207 |
| 6,949,954 B2 * | 9/2005 | Nystrom et al. | ................ | 326/93 |
| 2007/0040580 A1 * | 2/2007 | Zanchi et al. | .................. | 326/83 |
| 2007/0279100 A1 * | 12/2007 | Fallah et al. | ................... | 326/95 |

OTHER PUBLICATIONS

Yamauchi, Hiroyuki, Akamatsu, Hironori, Fujita, Tsutomu, An Asymptotically Zero Power Charge-Recycling Bus Architecture for Battery-Operated Ultrahigh Data Rate ULSI's, IEEE Journal of Solid-State Circuits, vol. 30, No. 4, Apr. 1995, pp. 423-431.
Rajapandian, Saravanan, Shepard, Kenneth L., Hazucha, Peter, Karnik, Tanay, High-Voltage Power Delivery Through Charge Recycling, IEEE Journal of Solid-State Circuits, vol. 41, No. 6, Jun. 2006, pp. 1400-1410.

* cited by examiner

*Primary Examiner*—Don P Le
*Assistant Examiner*—Jason Crawford
(74) *Attorney, Agent, or Firm*—William J. Kubida; Hogan & Hartson LLP

(57) ABSTRACT

A data bus charge-sharing technique for integrated circuit devices may be implemented utilizing two voltage regulators to generate constant voltages VEQ1 and VEQ2, which are in the particular exemplary implementation disclosed, approximately 0.9 times a supply voltage VCC and 0.1 times VCC, respectively. One set of signals switches between VCC and VEQ1, and a second set of signals switches between VEQ2 and 0V. Charge-sharing between the two sets of signals is accomplished by the unique configuration of the voltage regulators.

24 Claims, 12 Drawing Sheets

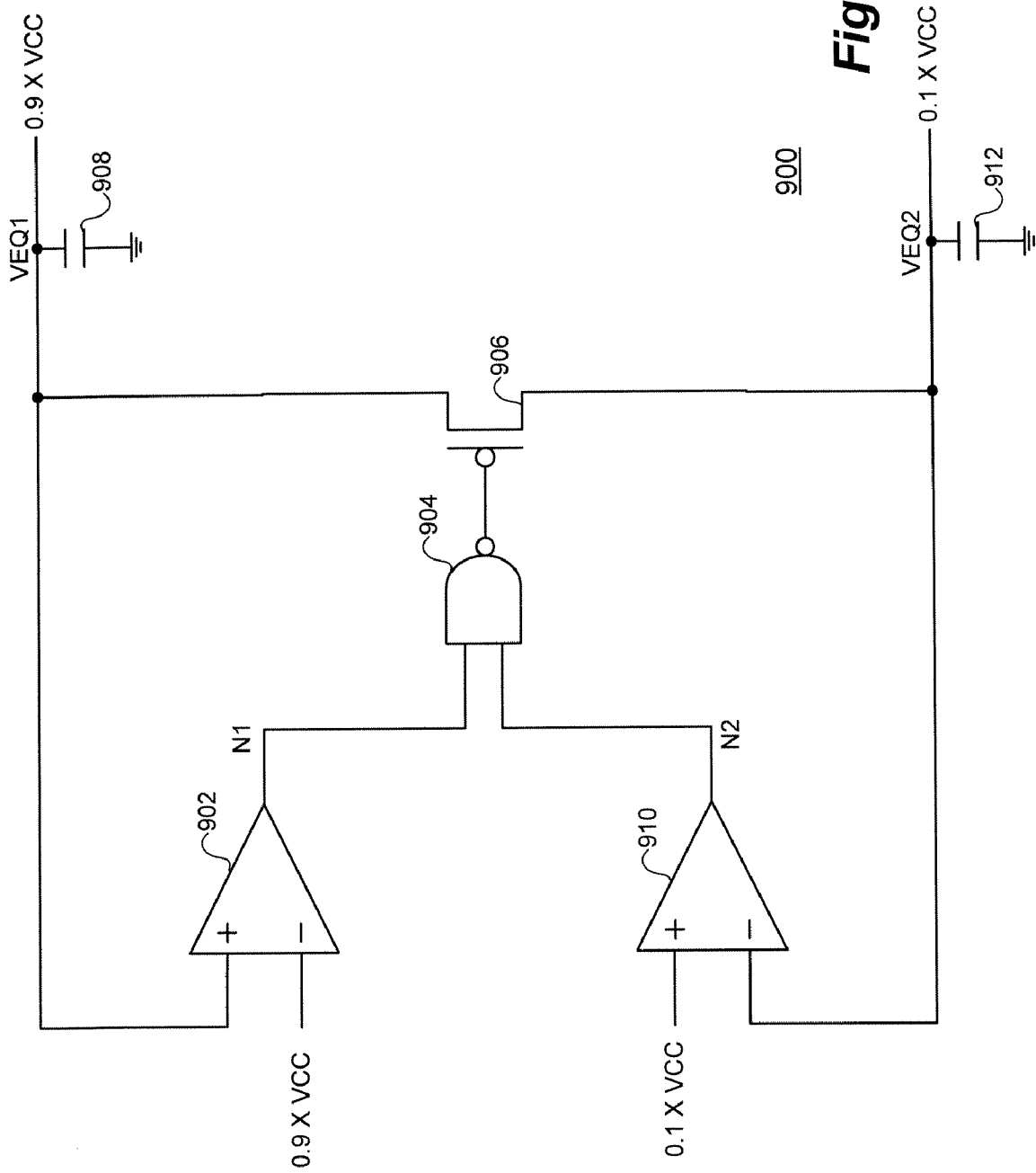

DATA BUS CHARGE-SHARING TECHNIQUE FOR INTEGRATED CIRCUIT DEVICES

CROSS REFERENCE TO RELATED PATENT APPLICATIONS

The present invention is related to U.S. patent application Ser. No. 11/625,728 filed Jan. 22, 2007 by Michael C. Parris, Douglas B. Butler and Kim C. Hardee for: "Switched Capacitor Charge-Sharing Technique for Integrated Circuit Devices Enabling Signal Generation of Disparate Selected Signal Values", and U.S. patent application Ser. No. 11/759,823 filed Jun. 7, 2007 by Michael C. Parris and Kim C. Hardee for: "Optimized Charge Sharing for Data Bus Skew Applications", both of which are assigned to United Memories, Inc., Colorado Springs, Colo. and Sony Corporation, Tokyo, Japan.

BACKGROUND OF THE INVENTION

The present invention relates, in general, to the field of semiconductor integrated circuit devices. More particularly, the present invention relates to a data bus charge-sharing technique for integrated circuit devices.

An integrated circuit device having a large number of internal data buses can have high power dissipation due to the data buses switching at high frequency. One way to reduce this power is to reduce the voltage swing on the data buses to a fraction of the power supply voltage, VCC. There are various ways to do this.

To further reduce power it is desirable to share charge between two or more sets of data buses. Conventional implementations of this technique have involved stacking circuits and/or data buses between the VCC and ground, where the highest voltage level of signals in one set of circuits and/or data buses is equal to the lowest voltage level of signals in another set of circuits and/or data buses. This scheme effectively shares charge between the two sets of circuits and/or data buses.

A novel and efficacious charge-sharing technique is disclosed in the aforementioned patent application. Utilizing this technique, charge is shared between two sets of small signal differential precharged data buses. One set of data buses switches between VCC and approximately 0.9 times VCC and the other set of data buses switches between 0.1 times VCC and 0V. In this case the lowest voltage level of one set of data buses is not set equal to the highest voltage level of the second set of data buses. Therefore, new methods of charge-sharing must be utilized.

In this previously referenced patent application, a switched capacitor circuit is disclosed as one means for providing the charge-sharing function. In this case, charge used to drive data lines from VCC to 0.9 times VCC in one set of data buses is also used to drive data lines from 0V to 0.1 times VCC in the second set of data buses. This charge is transferred, in the preferred embodiment, through the switched capacitors.

In the implementation of the particular technique disclosed in the previously filed patent application, the internal voltage levels, 0.9 times VCC and 0.1 times VCC, are determined by the relative capacitances on the two sets of data buses and the switched capacitor. Since this may possibly lead to some uncertainty in establishing these voltage levels, it could also result in increased power and/or insufficient signal levels. Moreover, this particular technique is most particularly applicable for differential precharged data buses and additional circuitry may be required to ensure reliable low frequency operation.

SUMMARY OF THE INVENTION

The charge-sharing technique of the present invention is an alternative to the switched capacitor method disclosed in U.S. patent application Ser. No. 11/625,728. In this approach two voltage regulators are used to generate constant voltages VEQ1 and VEQ2, which are in the particular exemplary implementation disclosed, approximately 0.9 times VCC and 0.1 times VCC, respectively. One set of signals switches between VCC and VEQ1, and a second set of signals switches between VEQ2 and 0V. Charge-sharing between the two sets of signals is accomplished by the unique configuration of the voltage regulators.

Particularly disclosed herein is an integrated circuit device comprising at least one first signal line capable of switching between a first voltage level and a higher second voltage level, at least one second signal line capable of switching between a differing third voltage level and a lower fourth voltage level and an asynchronous charge-sharing circuit coupled between a source of the first voltage level and a source of the third voltage level.

Also particularly disclosed herein is a method for operating an integrated circuit device comprising switching at least one first signal line between a first voltage level and a higher second voltage level, switching at least one second signal line between a differing third voltage level and a lower fourth voltage level and sharing charge between a source of the first voltage level and the third voltage level.

Still further disclosed herein is an integrated circuit device including a charge-sharing circuit coupled to first and second signal lines. The charge-sharing circuit comprises first and second voltage regulators configured to supply first and second voltage levels at respective outputs thereof. A first switching element has an input thereof coupled to the output of the first voltage regulator, with the first switching element being coupled between the first and second signal lines. A second switching element has an input thereof coupled to the output of the second voltage regulator, with the second switching element also being coupled between the first and second signal lines.

Also further disclosed herein is an integrated circuit device including a charge-sharing circuit coupled to first and second signal lines. The charge sharing circuit comprises first and second voltage regulators configured to supply first and second voltage levels at respective outputs thereof, a switching device coupled between the first and second signal lines and having a control terminal thereof and a logic gate coupled to the outputs of the first and second voltage regulators and having an output thereof coupled to the control terminal of the switching device.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 9 is a schematic illustration of a variation of the circuit of the preceding figure wherein the single N-channel transistor is replaced with a P-channel device and the NOR gate is replaced with a two-input NAND gate.

DESCRIPTION OF A REPRESENTATIVE EMBODIMENT

Figure 1A:
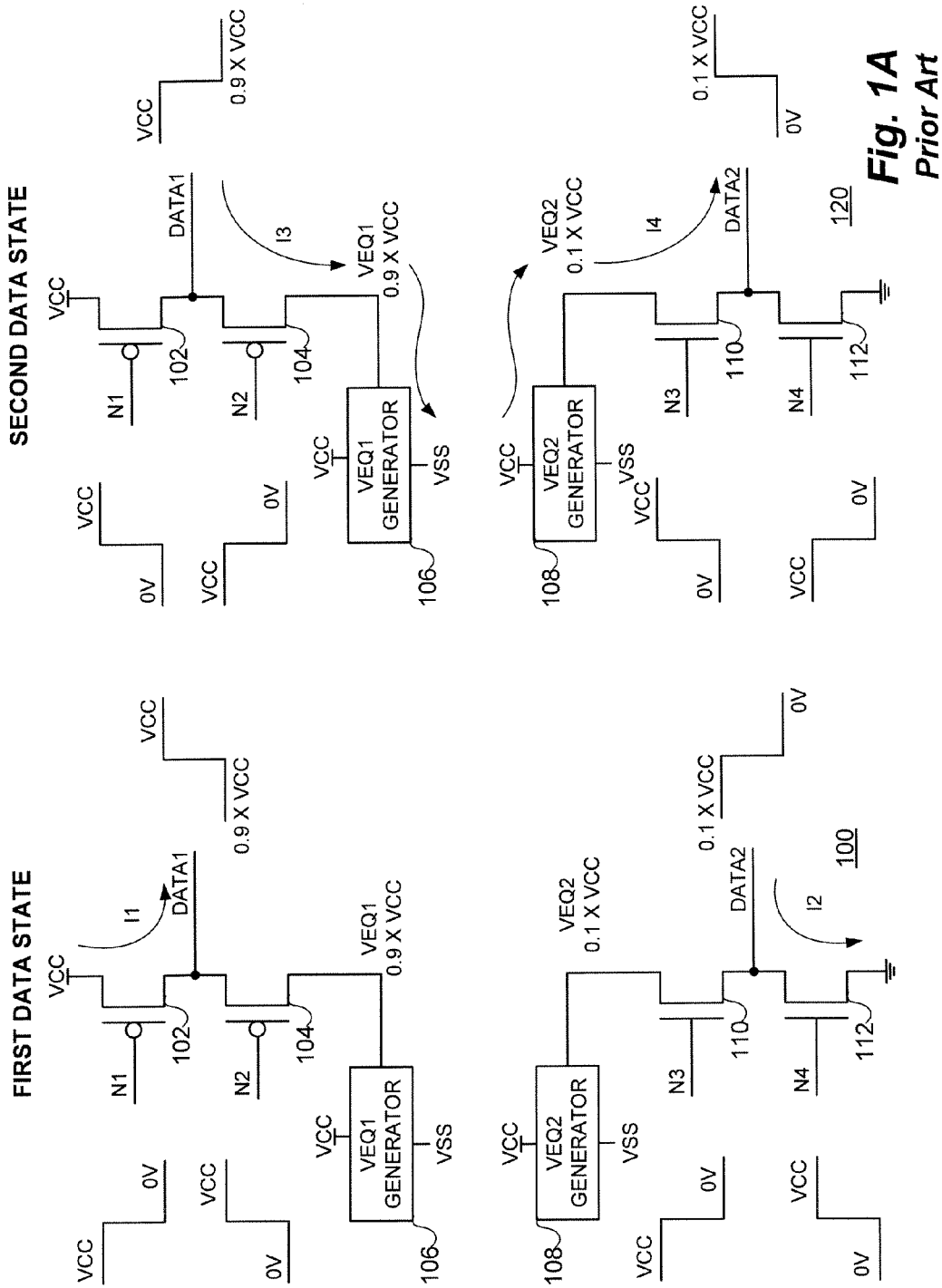
FIG. 1A is a schematic illustration of a circuit implementing a conventional technique providing small signal swing on two sets of signals without utilizing charge-sharing.

With reference now to FIG. 1A, a schematic illustration of a circuit implementing a conventional technique for providing small signal swing on two sets of signals without utilizing charge-sharing is shown.

The circuit is initially illustrated in a first data state 100 on the leftmost side of the figure and comprises series connected P-channel transistors 102 and 104 coupled between a source of supply voltage VCC and the output of a VEQ1 generator 106. The VEQ1 generator 106 is coupled between VCC and a reference voltage VSS, or circuit ground and provides an output voltage of 0.9×VCC.

As indicated, a signal transitioning between VCC and 0V is applied to node N1 at the gate of transistor 102 while a signal substantially simultaneously transitioning between 0V and VCC is applied to node N2 at the gate of transistor 104. A current I1 then flows through transistor 102 to a DATA1 output node intermediate transistors 102 and 104 providing a signal transitioning between a VEQ1 level of 0.9×VCC and VCC as shown.

The circuit further comprises a VEQ2 generator 108 coupled between VCC and VSS for providing a VEQ2 output voltage of 0.1×VCC to series connected N-channel transistors 110 and 112 coupled between VEQ2 and circuit ground. Also as indicated, a signal transitioning between VCC and 0V is applied to node N3 at the gate of transistor 110 while a signal substantially simultaneously transitioning between 0V and VCC is applied to node N4 at the gate of transistor 112. A current I2 then flows through transistor 112 from a DATA2 output node intermediate transistors 110 and 112 providing a signal on the DATA2 output node transitioning between a VEQ2 level of 0.1×VCC and 0V as shown.

In this figure, the circuit is also shown in a second data state 120. In this state, a signal transitioning from 0V to VCC is applied to node N1 while a signal transitioning from VCC to 0V is applied to node N2. At substantially the same time, a signal transitioning from 0V to VCC is applied to node N3 while a signal transitioning from VCC to 0V is applied to node N4. In this state, a current I3 flows from the DATA1 output through transistor 104 and the VEQ1 generator 106 to VSS causing an output signal level transitioning from VCC to 0.9×VCC as indicated. Further, a current I4 then flows through the VEQ2 generator 108 and transistor 110 to the DATA2 output node causing an output signal transitioning from 0V to 0.1×VCC.

The technique illustrated in FIG. 1 implements the provision of small signal swing on two sets of signals, but without charge-sharing. The DATA1 node is representative of a data line in the first set of signals that switch between VCC and VEQ1, which is approximately 0.9 times VCC. The DATA2 node is representative of a data line in the second set of signals that switch between 0V and VEQ2, which is approximately 0.1 times VCC.

The first data state 100 shows the DATA1 node being driven from VEQ1 to VCC by current I1 flowing from VCC to DATA1 through transistor 102. The DATA2 node is driven from VEQ2 to 0V by current I2 flowing from DATA2 through transistor 112 to VSS.

The second data state 120 shows the DATA1 node being driven from VCC to VEQ1 by current I3 flowing from DATA1 to VEQ1 through transistor 104. The DATA2 node is driven from 0V to VEQ2 by current I4 flowing from VCC to DATA2 through transistor 110.

Figure 1B:
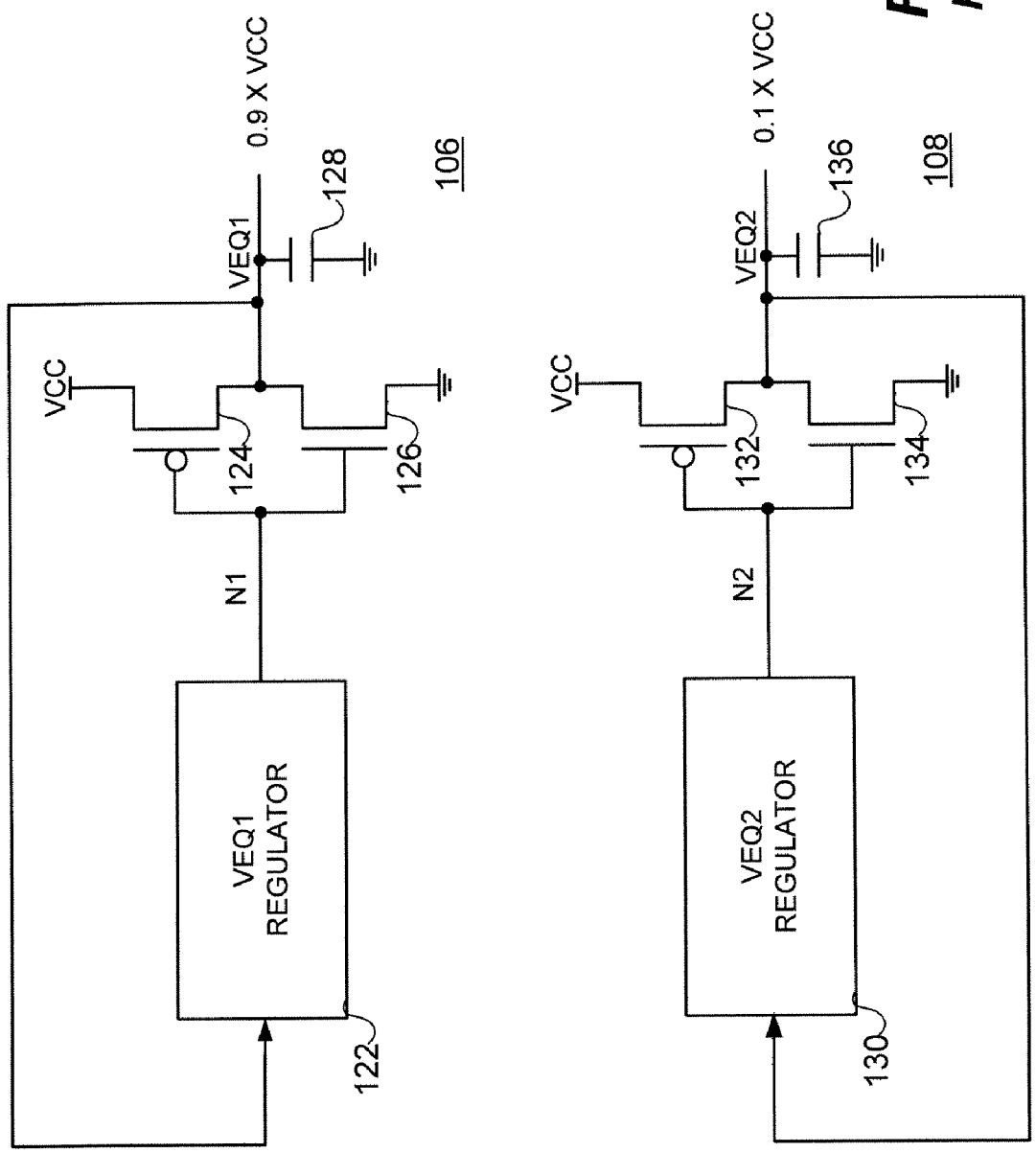
FIG. 1B is a follow-on schematic illustration of how the VEQ1 and VEQ2 generators of the preceding figure might be implemented.

With reference additionally now to FIG. 1B, a follow-on schematic illustration is provided showing how the VEQ1 and VEQ2 generators 106, 108 of the preceding figure might be implemented.

The VEQ1 generator 106 comprises a VEQ1 voltage regulator 122 with an output stage comprising series coupled P-channel transistor 124 and N-channel transistor 126 coupled as a CMOS inverter between VCC and circuit ground. A voltage level VEQ1 of 0.9×VCC is provided at the output thereof having a filter capacitor 128. Similarly, the VEQ2 generator 108 comprises a VEQ2 voltage regulator 130 with an output stage comprising series coupled P-channel transistor 132 and N-channel transistor 134 coupled as a CMOS inverter between VCC and circuit ground. A voltage level VEQ2 of 0.1×VCC is provided at the output thereof also having a filter capacitor 136.

In operation, the VEQ1 regulator 122 senses the level of VEQ1 and turns on either transistor 124 or 126 to keep the level of VEQ1 at 0.9 times VCC. Additionally, the VEQ2 regulator 130 senses the level of VEQ2 and turns on either transistor 132 or 134 to keep the level of VEQ2 at 0.1 times VCC. No charge-sharing is provided in this circuit since all of the charge used to hold VEQ1 and VEQ2 at the desired levels flows out of the VCC supply and into VSS (circuit ground).

As will be described in more detail with respect to the succeeding figures, through implementation of the technique of the present invention, it is the charge that is transferred due to currents I3 and I4 that is shared. Essentially, instead of drawing current from VCC to drive node DATA2 to VEQ2, some or all of the current I4 flows from VEQ1. Since current I3 flows into VEQ1, then the charge flowing into VEQ1 due to current I3 driving node DATA1 to VEQ1 is used to supply the charge required for current I4 to drive node DATA2 to VEQ2.

This is the action that shares charge between the two sets of data buses represented by nodes DATA1 and DATA2. The technique of the present invention effectively reduces the current from VCC by a factor of 2 if the capacitances on the two sets of signals are equal.

Figure 2A:
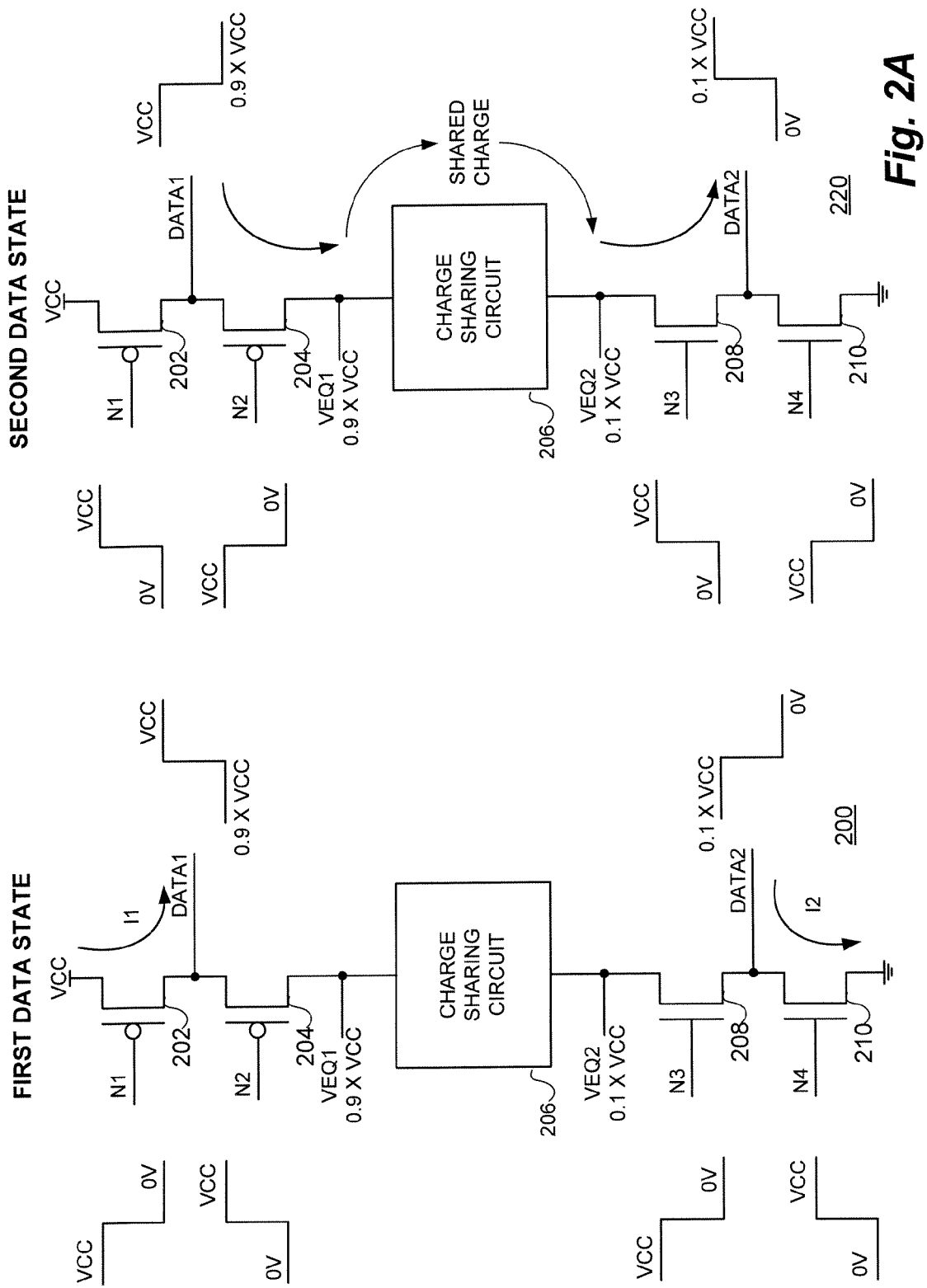
FIG. 2A is a schematic illustration of a circuit for implementing the data bus charge-sharing technique of the present invention wherein the current flow in the second data state is effectuated between a charge-sharing circuit coupling VEQ1 and VEQ2.

With reference additionally now to FIG. 2A, a schematic illustration of a circuit for implementing the data bus charge-sharing technique of the present invention is shown wherein the current flow in the second data state is effectuated between a charge-sharing circuit coupling VEQ1 and VEQ2.

As before, the circuit is initially illustrated in a first data state 200 on the leftmost side of the figure and comprises series connected P-channel transistors 202 and 204 coupled between a source of supply voltage VCC and a VEQ1 level of 0.9×VCC received at one terminal of a charge-sharing circuit 206. In the embodiment of the present invention shown, the charge-sharing circuit is preferably asynchronous, that is, non-clocked by a clocking signal although one or more enable inputs may still be provided. As indicated, a signal transitioning between VCC and 0V is applied to node N1 at the gate of transistor 202 while a signal substantially simultaneously transitioning between 0V and VCC is applied to node N2 at the gate of transistor 204. A current I1 then flows through transistor 202 to a DATA1 output node intermediate transistors 202 and 204 providing a signal transitioning between a VEQ1 level of 0.9×VCC and VCC as shown.

The charge-sharing circuit 206 also has another terminal coupled to a VEQ2 voltage of 0.1×VCC which is provided to series connected N-channel transistors 208 and 210 coupled between VEQ2 and circuit ground. Also as indicated, a signal transitioning between VCC and 0V is applied to node N3 at the gate of transistor 208 while a signal substantially simultaneously transitioning between 0V and VCC is applied to node N4 at the gate of transistor 210. A current I2 then flows through transistor 210 from a DATA2 output node intermediate transistors 208 and 210 providing a signal on the DATA2 output node transitioning between a VEQ2 level of 0.1×VCC and 0V as shown.

In this figure, the circuit is also shown in a second data state 220. In this state, a signal transitioning from 0V to VCC is applied to node N1 while a signal transitioning from VCC to 0V is applied to node N2. At substantially the same time, a signal transitioning from 0V to VCC is applied to node N3 while a signal transitioning from VCC to 0V is applied to node N4. In this state, a current including a shared charge flows from the DATA1 output node through transistor 204, the charge-sharing circuit 206 and transistor 208 to the DATA2 output node. As shown, while the DATA1 node transitions from VCC to 0.9×VCC, the DATA2 node transitions from 0V to 0.1×VCC.

This figure illustrates the basic operation of an embodiment of a circuit for implementing the technique of the present invention. For the first data state 200, the current flow is the substantially the same as shown in the preceding figures. However, in the second data state 220, the current used to drive the DATA1 node from VCC to VEQ1 is used to drive the DATA2 from 0V to VEQ2. This is accomplished through the charge-sharing circuit 206 connected between VEQ1 and VEQ2.

This implementation of the present invention allows, in this particular example, for charge-sharing between sets of single-ended (non-differential) signals. The amount of charge-sharing is dependent on the data patterns on one set/of signals with respect to the other set of signals. Ideally the data pattern on one set of signals would be the complement of the other set. An application in which this occurs is one in which one set of signals is pipelined and inverted to generate the second set of signals, for example, local data lines and global data lines. Another example might be control and address signals that are routed across an integrated circuit chip and then pipelined and re-routed to minimize the total delay.

Figure 2B:
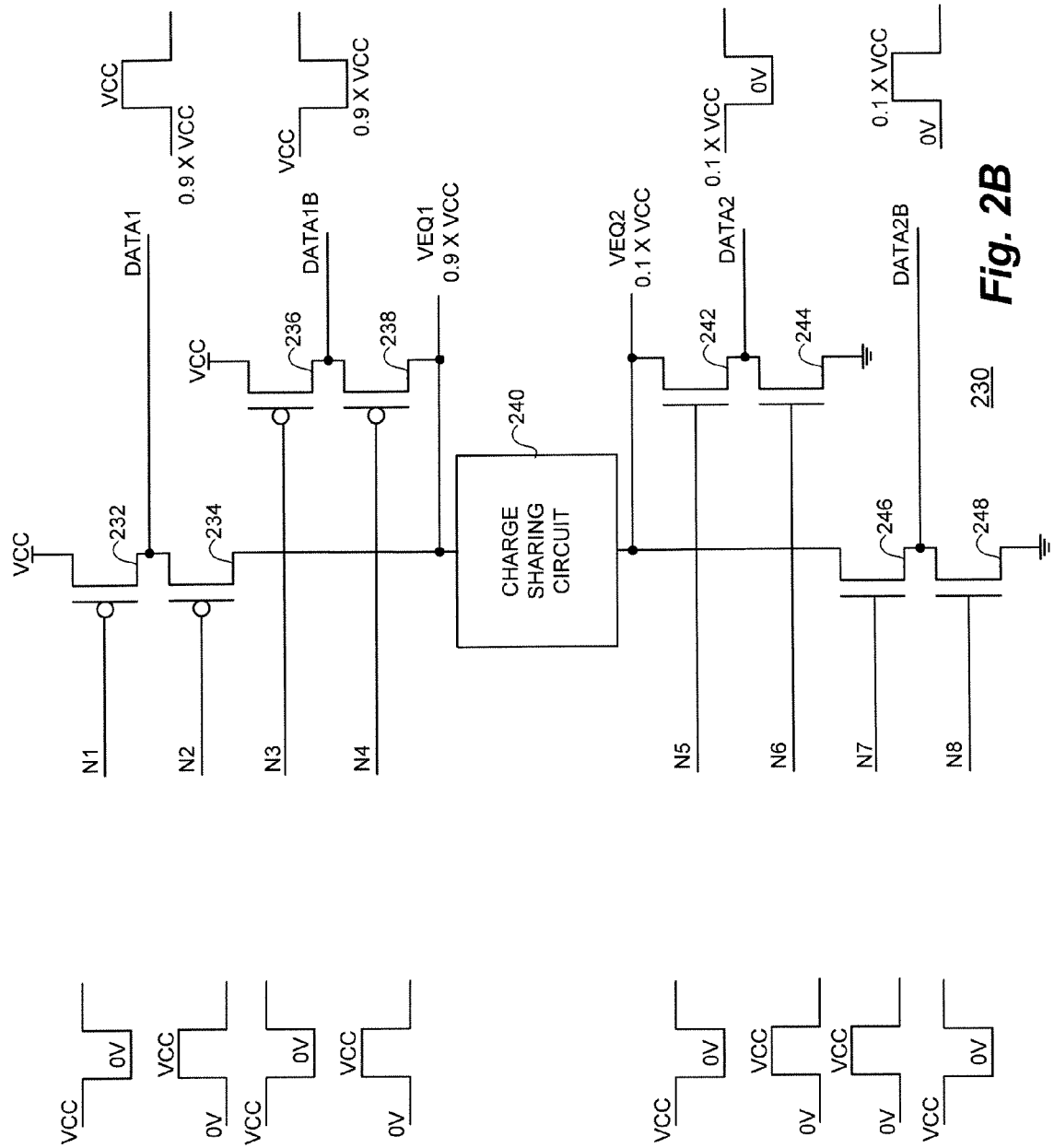
FIG. 2B is a schematic illustration of another circuit implementation of the data bus charge-sharing technique of the present invention for use with two sets of differential data buses.

With reference additionally now to FIG. 2B, a schematic illustration of another circuit implementation of the data bus charge-sharing technique of the present invention is shown for use with two sets of differential data buses.

The circuit 230 comprises series coupled P-channel transistors 232 and 234 coupled between VCC and a VEQ1 level of 0.9×VCC received at one terminal of a charge-sharing circuit 240. As indicated, a signal transitioning between VCC and 0V and back to VCC is applied to node N1 at the gate of transistor 232 while a signal substantially simultaneously transitioning between 0V and VCC and back to 0V is applied to node N2 at the gate of transistor 234. The circuit 230 further comprises series coupled P-channel transistors 236 and 238 coupled between VCC and VEQ1. As further indicated, a signal transitioning between VCC and 0V and back to VCC is applied to node N3 at the gate of transistor 236 while a signal substantially simultaneously transitioning between 0V and VCC and back to 0V is applied to node N4 at the gate of transistor 238.

The circuit 230 further comprises a VEQ2 source of 0.1× VCC coupled to another terminal of the charge-sharing circuit 240 for providing a VEQ2 voltage to series coupled N-channel transistors 242 and 244 coupled between VEQ2 and circuit ground. Series coupled N-channel transistors 246 and 248 are also coupled between VEQ2 and circuit ground. As indicated, a signal transitioning between VCC and 0V and back to VCC is applied to node N5 at the gate of transistor 242 while a signal substantially simultaneously transitioning between 0V and VCC and back to 0V is applied to node N6 at the gate of transistor 244. In addition, a signal transitioning between 0V and VCC and back to 0V is applied to Node N7 at the gate of transistor 246 while a signal transitioning between VCC to 0V and back to VCC is applied to Node N8 at the gate of transistor 248.

As indicated in this figure, two sets of differential data buses are shown represented by DATA1, DATA1B and DATA2, DATA2B. In this case, DATA1 is the complement of DATA1B, and DATA2 is the complement of DATA2B. In operation, the DATA1 bus transitions between VEQ1 and VCC and back to VEQ1 while the DATA1B bus transitions between VCC and VEQ1 and back to VCC. In like manner, the DATA2 bus transitions between VEQ2 and 0V and back to VEQ2 while the DATA2B bus transitions between 0V and VEQ2 and back to 0V.

Figure 2C:
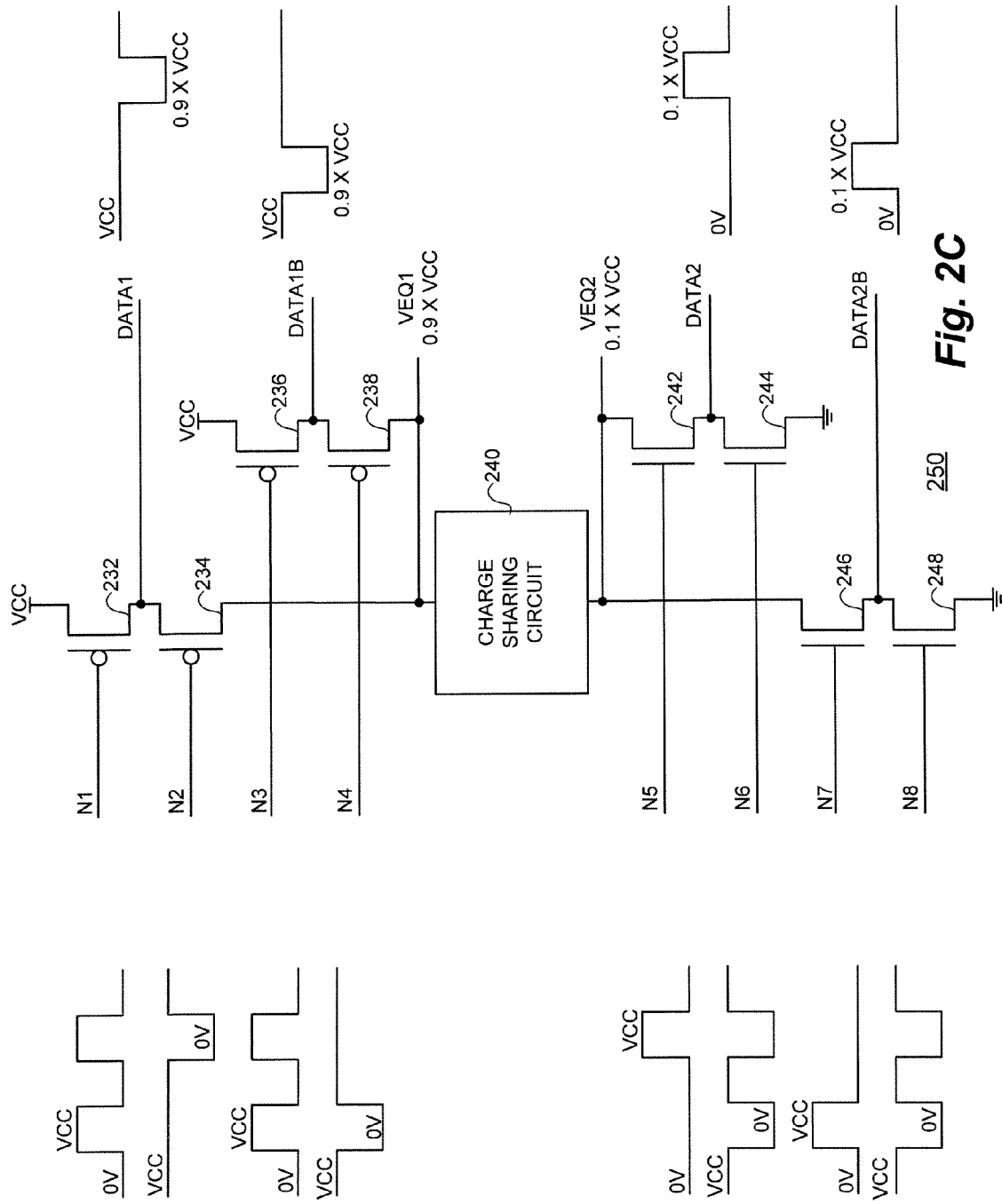
FIG. 2C is a further schematic illustration of the circuit implementation of the preceding figure but wherein the differential data buses are precharged.

With reference additionally now to FIG. 2C, a further schematic illustration of the circuit implementation of the preceding figure is shown wherein the differential data buses are precharged. In this figure, the circuit 250 comprises like structure to that previously described and illustrated and the foregoing description thereof shall suffice herefor. The signals input to the nodes N1 through N8 are as indicated to provide the output signals on the differential data buses as shown.

As illustrated, the two sets of differential data buses (DATA1/DATA1B and DATA2/DATA2B) are precharged with DATA1 and DATA1B being precharged to VCC, and DATA2 and DATA2B being precharged to VSS. The advantage of this particular implementation is that efficient charge-sharing occurs independently of the data patterns of the data buses. Ideally the capacitance on one set of data buses would be substantially equal to the capacitance on the other set of data buses.

Figure 3:
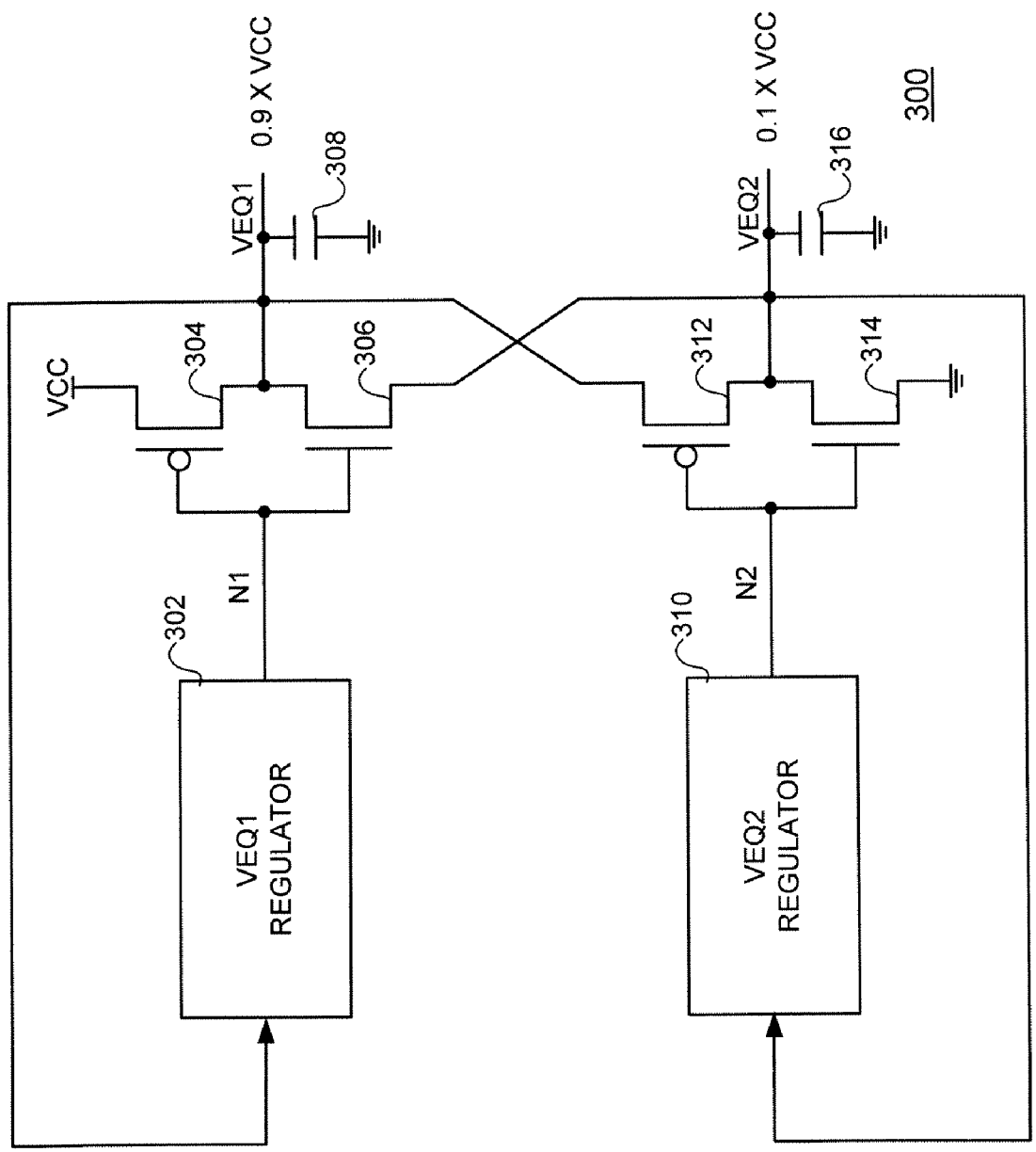
FIG. 3 is a schematic illustration of a circuit for implementing the charge-sharing technique of the present invention.

With reference additionally now to FIG. 3, a schematic illustration of a possible embodiment of a charge-sharing circuit 300 for implementing the charge-sharing technique of the present invention is shown. The circuit 300 comprises a VEQ1 voltage regulator 302 with an output stage comprising P-channel transistor 304 and series coupled N-channel transistor 306. The source terminal of transistor 306 is coupled to the VEQ2 node. The source terminal of transistor 304 is coupled to VCC while the drain terminals of transistors 304 and 306 are coupled to a VEQ1 node providing an output voltage of substantially 0.9×VCC. A filter capacitor 308 couples the VEQ1 node to circuit ground.

In like manner, the circuit 300 further comprises a VEQ2 voltage regulator 310 with an output stage comprising P-channel transistor 312 and series coupled N-channel transistor 314. The source terminal of transistor 312 is coupled to the VEQ1 node while the drain terminals of transistors 312 and 314 are coupled to a VEQ2 node providing an output voltage of substantially 0.1×VCC. The source terminal of transistor 314 is coupled to VSS. A filter capacitor 316 couples the VEQ2 node to circuit ground.

The unique connections of transistors 306 and 312 effectively implement the charge-sharing operation of the present invention with the source of transistor 306 being coupled to node VEQ2 instead of VSS, and the source of transistor 312 being coupled to node VEQ1 instead of VCC. Since charge flows into node VEQ1 due to DATA1 switching to VEQ1, as shown in FIG. 2A, the voltage of VEQ1 will tend to rise. If VEQ1 rises above 0.9×VCC, then the VEQ1 regulator 302 will cause node N1 (FIG. 3) to go "high", turning on transistor 306. Current will then flow from VEQ1 to VEQ2, helping to keep VEQ1 at 0.9 times VCC.

Since charge flows out of node VEQ2 due to DATA2 switching to VEQ2, then VEQ2 will tend to fall. If VEQ2 falls below 0.1×VCC, then the VEQ2 regular 310 will cause node N2 (FIG. 3) to go "low", turning on transistor 312. Current will then flow from node VEQ1 to VEQ2, helping to keep node VEQ2 at 0.1×VCC. In this way, the charge required to drive data line DATA1 "low" (to VEQ1) is used to drive signal DATA2 "high" (to VEQ2).

As also shown in this figure, if VEQ1 goes lower than 0.9×VCC, then the VEQ1 regulator 302 will cause node N1 (FIG. 3) to go "low", turning on transistor 304, which will cause current to flow from VCC to VEQ1, raising the level of VEQ1. If VEQ2 goes higher than 0.1×VCC, then the VEQ2 regulator 310 will cause node N2 (FIG. 3) to go "high", turning on transistor 314, which will cause current to flow from VEQ2 to VSS, lowering the level of VEQ2.

Figure 4:
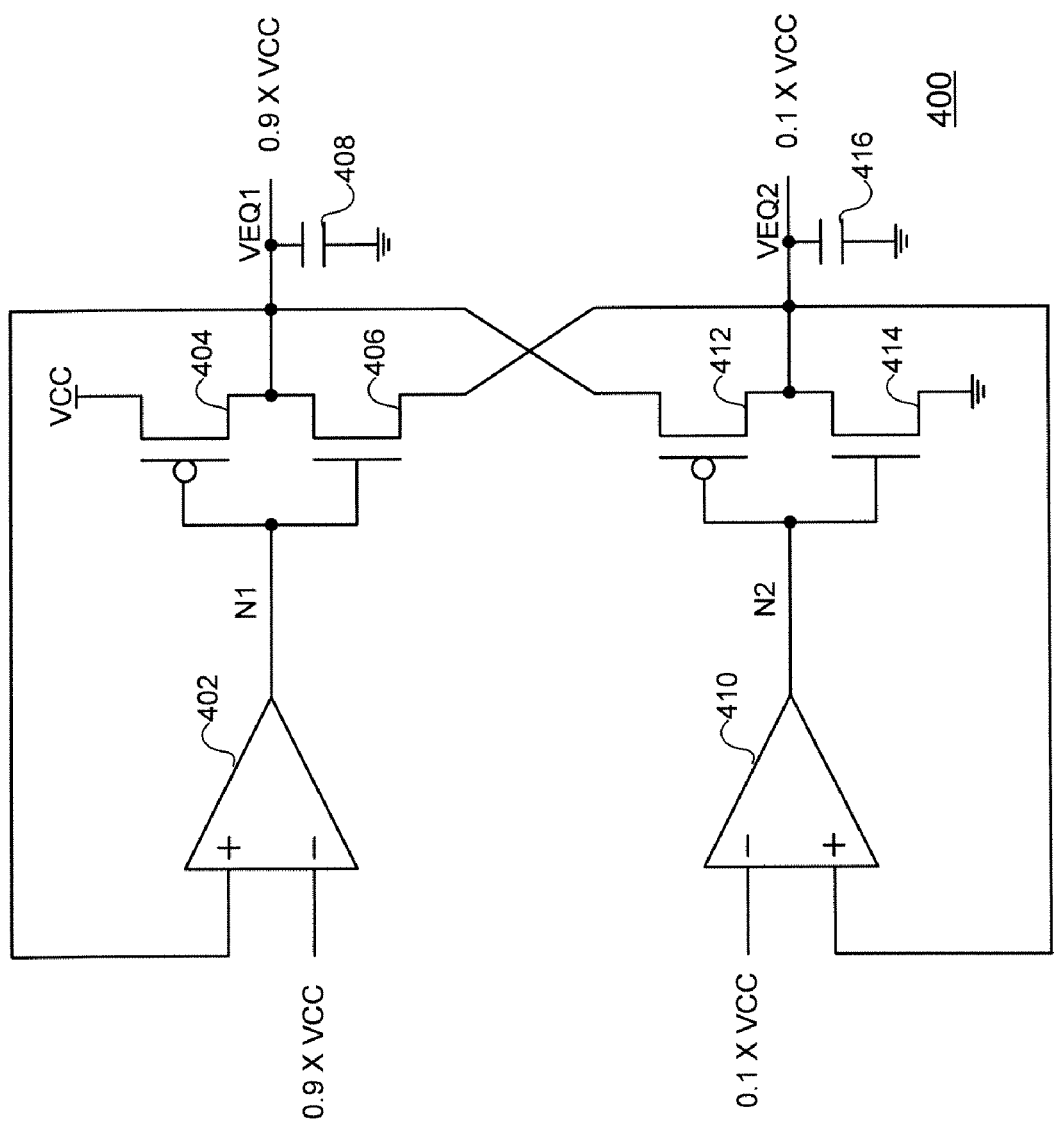
FIG. 4 is a follow-on schematic illustration of a possible circuit implementation for the VEQ1 and VEQ2 regulators of the preceding figure.

With reference additionally now to FIG. 4, a follow-on schematic illustration of a possible circuit implementation for the VEQ1 and VEQ2 regulators 302, 310 of the charge-sharing circuit 300 of the preceding figure is shown. In this figure, the transistors 404, 406, 412 and 414 are directly analogous to the transistors 304, 306, 312 and 314 of FIG. 3. The filter capacitors 408 and 416 also correspond to the filter capacitors 308 and 316.

In this figure, one possible implementation of the VEQ1 and VEQ2 regulators is shown. A voltage comparator 402 with its positive input connected to VEQ1 and its negative input connected to 0.9×VCC is utilized for the VEQ1 regulator. If the level of VEQ1 drifts below 0.9×VCC then node N1 goes "low". If VEQ1 drifts above 0.9×VCC, then node N1 goes "high". A voltage comparator 410 with its positive input connected to 0.1×VCC and its negative input connected to VEQ2 is utilized for the VEQ2 regulator. If the level of VEQ2 drifts above 0.1×VCC, then node N2 goes "high". On the other hand, if the level of VEQ2 drifts below 0.1×VCC, then node N2 goes "low". It should be noted that any ratio (or fraction) of VEQ1 and VEQ2 can be compared to the appropriate ratio (or fraction) of VCC to provide the equivalent functionality.

Figure 5:
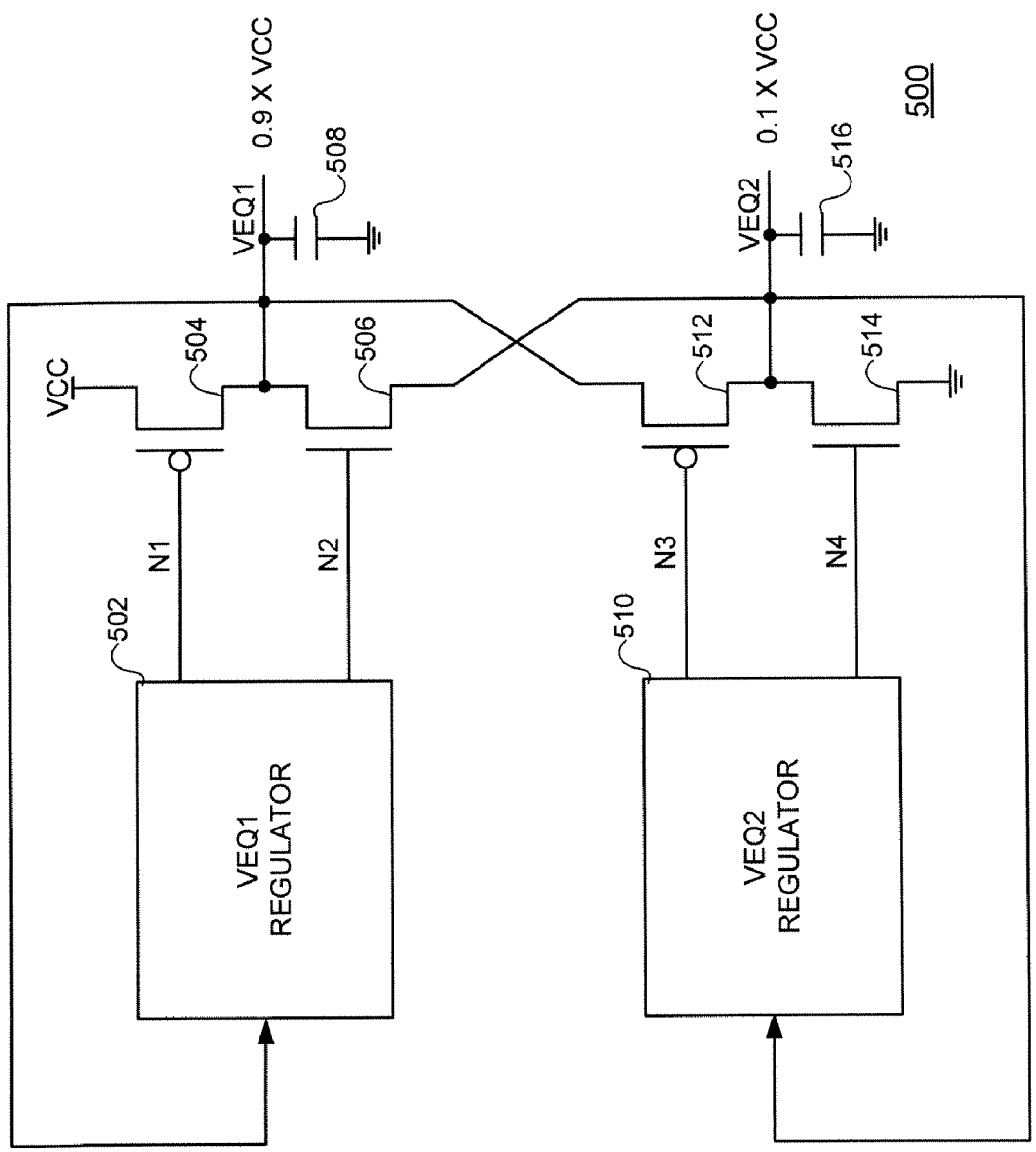
FIG. 5 is another schematic illustration of a further possible circuit implementation of the charge-sharing technique of the present invention constituting a modification to the circuit of FIG. 3.

With reference additionally now to FIG. 5, another schematic illustration of a further possible circuit implementation of the charge-sharing technique of the present invention is shown constituting a further modification to the circuit of FIG. 3. In this figure of a circuit 500, the transistors 504, 506, 512 and 514 are also directly analogous to the transistors 304, 306, 312 and 314 of FIG. 3. The filter capacitors 508 and 516 also correspond to the filter capacitors 308 and 316.

In the embodiment of circuit 500, the gates of transistors 504 and 506 are connected to difference nodes, N1 and N2. Nodes N1 and N2 respond slightly differently to the level of VEQ1 to avoid through-current in the output driver comprising transistors 504 and 506. As the level of VEQ1 drifts "low", node N2 goes "low" before node N1 goes "low" thereby turning "off" transistor 506 before transistor 504 turns "on". Conversely, as the level of VEQ1 drifts "high", node N1 goes "high" before node N2 goes "high" thereby turning "off" transistor 504 before transistor 506 turns "on".

Similarly, the gates of transistors 512 and 514 are respectively coupled to nodes N3 and N4. As the level of VEQ2 drifts "high", node N3 goes "high" before node N4 goes "high" thereby turning "off" transistor 512 before transistor 514 turns "on". Also, as the level of VEQ2 drifts "low", node N4 goes "low" before node N3 goes "low" thereby turning "off" transistor 514 before transistor 512 turns "on".

Figure 6:
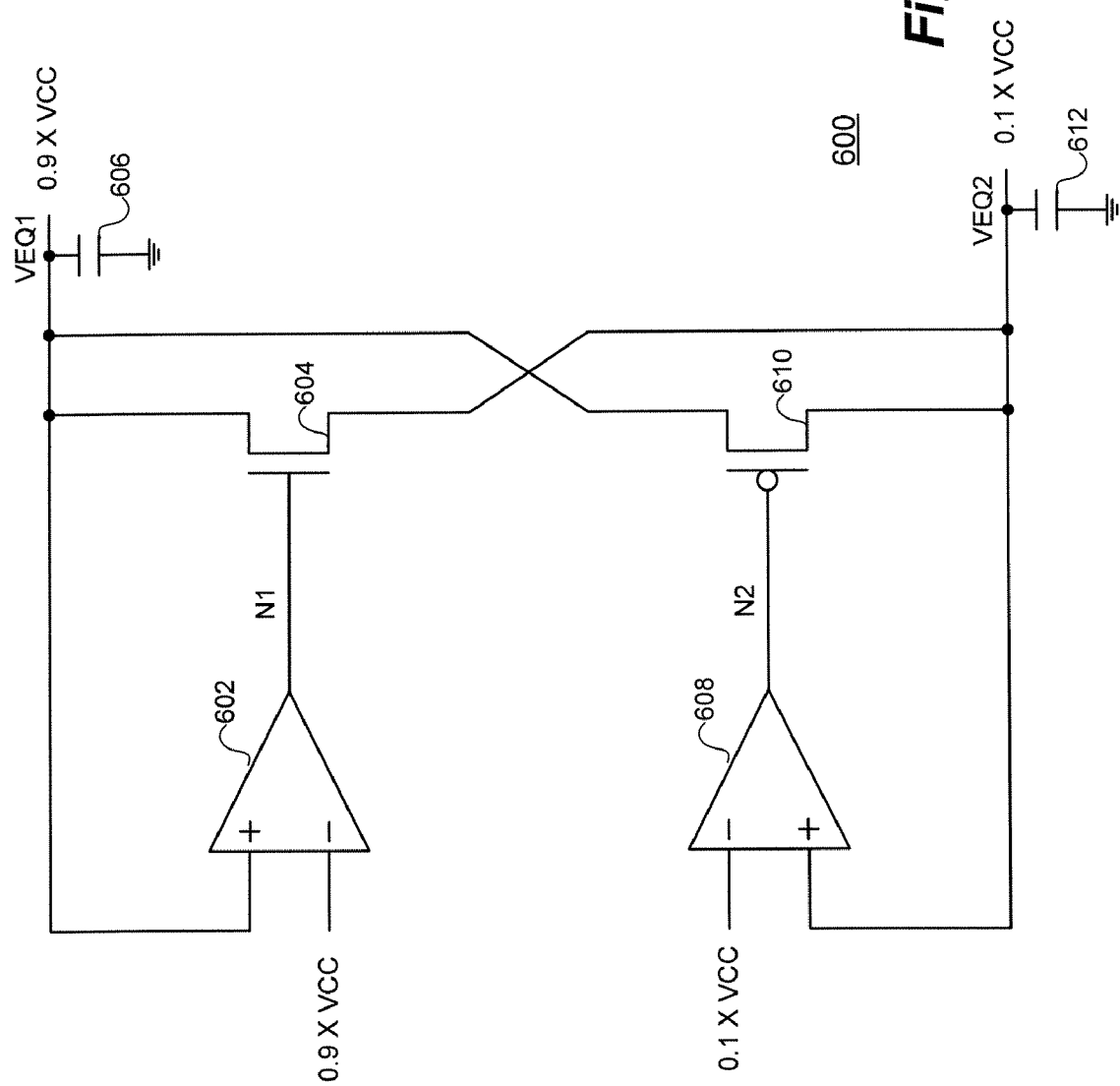
FIG. 6 is a further schematic illustration of still another possible circuit implementation of the charge-sharing technique of the present invention constituting a modification to the circuit of FIG. 4.

With reference additionally now to FIG. 6, yet another schematic illustration of a further possible circuit implementation of the charge-sharing technique of the present invention is shown constituting a modification to the circuit of FIG. 4. In this circuit 600, a voltage comparator 602 has the VEQ1 output level at its positive input and 0.9×VCC at its negative input. Output of the comparator 602 on node N1 is coupled to the gate of an N-channel transistor 604 having its drain terminal coupled to VEQ1 and its source terminal coupled to VEQ2. A filter capacitor 606 couples VEQ1 to circuit ground.

In like manner, another voltage comparator 608 has the VEQ2 output level at its positive input and 0.1×VCC at its negative input. Output of the comparator 608 on node N2 is coupled to the gate of a P-channel transistor 610 having its source terminal coupled to VEQ1 and its drain terminal coupled to VEQ2. A filter capacitor 612 couples VEQ2 to circuit ground.

In this particular circuit 600, there is no pull-up transistor on VEQ1 and no pull-down transistor on VEQ2. The voltage levels on VEQ1 and VEQ2 are determined by the relative capacitances on DATA1 and DATA2 (e.g. FIG. 2A). The advantage of this configuration is more efficient charge-sharing while a possible downside is the relative uncertainty of the voltage levels of VEQ1 and VEQ2.

Figure 7:
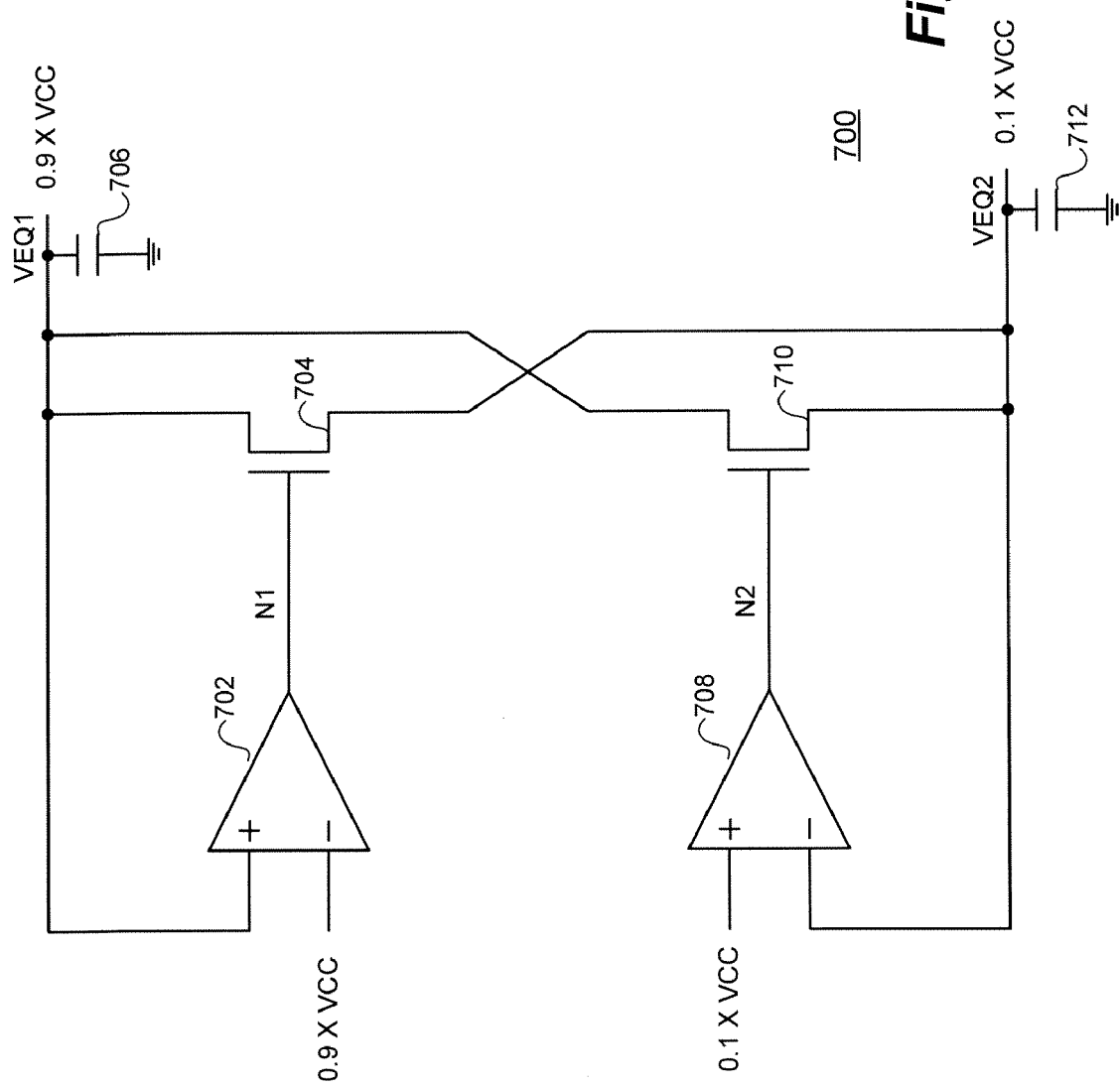
FIG. 7 is a schematic illustration of a variation of the circuit of the preceding figure utilizing an N-channel transistor instead of a P-channel device and wherein the inputs to the VEQ2 comparator are swapped.

With reference additionally now to FIG. 7, a schematic illustration of a variation of the circuit of the preceding figure is shown utilizing an N-channel transistor 710 instead of a P-channel device (610, FIG. 6) and wherein the inputs to the VEQ2 comparator are swapped. In this figure, comparator 702 corresponds to comparator 602, transistor 704 to transistor 604, capacitor 706 to capacitor 606, comparator 708 to comparator 608 and capacitor 712 to capacitor 612.

In essence, the circuit 700 shown is the fundamentally the same as the circuit 600 of FIG. 6 except that P-channel transistor 610 is replaced with N-channel transistor 710. Also, the inputs of the VEQ2 comparator 708 are swapped. This circuit provides improved transfer of charge between VEQ1 and VEQ2 due to inherently higher transconductance of N-channel transistors compared to P-channel devices.

Figure 8:
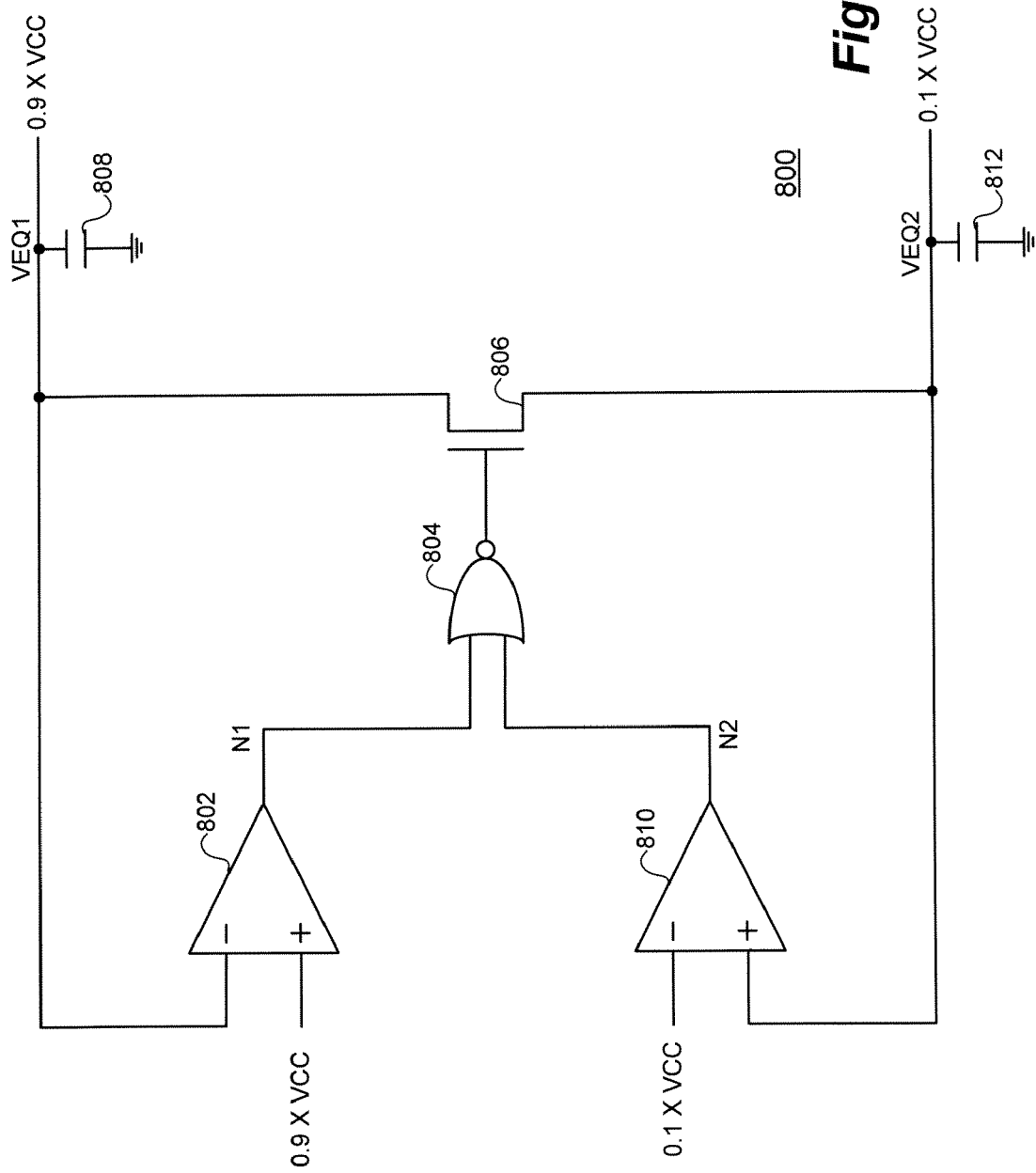
FIG. 8 is a schematic illustration of a variation of the circuit of the preceding figure wherein the lower transistor is removed and the single N-channel transistor is driven by the output of a two-input NOR gate.

With reference additionally now to FIG. 8, a schematic illustration of a variation of the circuit of the preceding figure is shown wherein the lower transistor is removed and the single N-channel transistor is driven by the output of a two-input NOR gate. The circuit 800 comprises a voltage comparator 802 with its negative input coupled to VEQ1 and its positive input coupled to 0.9×VCC. Output of the comparator 802 on node N1 is supplied as one input to a two-input NOR gate 804 which has its output coupled to the gate terminal of an N-channel transistor 806 coupled between VEQ1 and VEQ2. Another voltage comparator 810 has its positive input coupled to VEQ2 wand its negative input coupled to 0.1× VCC. Its output at node N2 is coupled to the other input of the NOR gate 804. Filter capacitors 808 and 812 respectively couple the VEQ1 and VEQ2 lines to circuit ground.

In circuit 800, transistor 710 (FIG. 7) has been omitted and the gate of transistor 806 is coupled to the output of NOR gate 804 with its inputs connected to nodes N1 and N2. The outputs of the VEQ1 and VEQ2 comparators 802, 810 are combined to turn transistor 806 "on" and "off". The configuration of circuit 800 comprises a simplification of the circuit illustrated and described with respect to FIG. 7.

With reference additionally now to FIG. 9, a schematic illustration of a variation of the circuit of the preceding figure is shown wherein the single N-channel transistor (806, FIG. 8) is replaced with a P-channel device and the NOR gate is replaced with a two-input NAND gate.

The circuit 900 comprises a voltage comparator 902 with its positive input coupled to VEQ1 and its negative input coupled to 0.9×VCC. Output of the comparator 902 on node N1 is supplied as one input to a two-input NAND gate 904 which has its output coupled to the gate terminal of a P-channel transistor 906 coupled between VEQ1 and VEQ2. Another voltage comparator 910 has its negative input coupled to VEQ2 wand its positive input coupled to 0.1× VCC. Its output at node N2 is coupled to the other input of the NAND gate 904. Filter capacitors 908 and 912 respectively couple the VEQ1 and VEQ2 lines to circuit ground.

The circuit 900 is similar to the circuit 800 in FIG. 8. except transistor 906 is now a P-channel device and the NOR gate 804 (FIG. 8) is now replaced with a NAND gate 904. Also as can be seen, the inputs to the comparators 902 and 910 have been swapped.

While there have been described above the principles of the present invention in conjunction with specific circuitry and representative voltage levels, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. An integrated circuit device comprising:
    at least one first signal line capable of switching between a first voltage level and a higher second voltage level;
    at least one second signal line capable of switching between a differing third voltage level and a lower fourth voltage level, said first voltage level being higher than said third voltage level; and
    an asynchronous charge-sharing circuit coupled between a source of said first voltage level and a source of said third voltage level.

2. The integrated circuit device of claim 1 wherein said second voltage level is substantially VCC.

3. The integrated circuit device of claim 1 wherein said fourth voltage level is substantially VSS.

4. The integrated circuit device of claim 1 wherein said at least one first and second signal lines comprise data lines.

5. The integrated circuit device of claim 1 wherein each of said at least one first and second signal lines comprise complementary pairs of data lines.

6. The integrated circuit device of claim 1 wherein said first and third voltage levels are set by respective voltage regulators.

7. The integrated circuit device of claim 1 wherein said current-sharing circuit is configured to direct current utilized to prevent said first voltage level from rising, into said third voltage level.

8. The integrated circuit device of claim 1 wherein said current-sharing circuit is configured to direct current utilized to prevent said third voltage level from falling, into said first voltage level.

9. A method for operating an integrated circuit device comprising:
    switching at least one first signal line between a first voltage level and a higher second voltage level;
    switching at least one second signal line between a differing third voltage level and a lower fourth voltage level, said first voltage level being higher than said third voltage level;
    providing an asynchronous charge-sharing circuit; and
    utilizing said charge-sharing circuit to share charge between a source of said first voltage level and said third voltage level.

10. The method of claim 9 wherein said operation of sharing charge comprises:
    directing current utilized to prevent said first voltage level from rising into said third voltage level.

11. The method of claim 9 wherein said operation of sharing charge comprises:
    directing current utilized to prevent said third voltage from falling into said first voltage level.

12. An integrated circuit device including a charge-sharing circuit coupled to first and second signal lines, said charge-sharing circuit comprising:
   first and second asynchronous voltage regulators configured to supply first and second voltage levels at respective outputs thereof;
   a first switching element having an input thereof coupled to said output of said first voltage regulator, said first switching element being coupled between said first and second signal lines; and
   a second switching element having an input thereof coupled to said output of said second voltage regulator, said second switching element being coupled between said first and second signal lines.

13. The integrated circuit device of claim 12 wherein said first and second switching elements comprise MOS transistors.

14. The integrated circuit device of claim 12 wherein said first and second switching elements comprise respective first and second groups of series coupled P-channel and N-channel transistors having their gate terminals coupled to said output of said respective first and second voltage regulators.

15. The integrated circuit device of claim 14 wherein said first group of said series coupled P-channel and N-channel transistors has a first output node coupled to said first signal line and is coupled between a supply voltage line and said second signal line.

16. The integrated circuit device of claim 14 wherein said second group of said series coupled P-channel and N-channel transistors has a second output node coupled to said second signal line and is coupled between a reference voltage line and said first signal line.

17. The integrated circuit device of claim 12 wherein said first and second voltage regulators comprise voltage comparators.

18. The integrated circuit device of claim 12 further comprising first and second filter capacitors respectively coupling said first and second signal lines to a reference voltage line.

19. An integrated circuit device including a charge-sharing circuit coupled to first and second signal lines, said charge sharing circuit comprising:
   first and second asynchronous voltage regulators configured to supply first and second voltage levels at respective outputs thereof;
   a switching device coupled between said first and second signal lines and having a control terminal thereof; and
   a logic gate coupled to said outputs of said first and second voltage regulators and an output thereof coupled to said control terminal of said switching device.

20. The integrated circuit device of claim 19 wherein said first and second voltage regulators comprise voltage comparators.

21. The integrated circuit device of claim 19 wherein said switching device comprises an MOS transistor.

22. The integrated circuit device of claim 21 wherein said MOS transistor comprises a P-channel device.

23. The integrated circuit device of claim 22 wherein said logic gate comprises a NAND gate.

24. The integrated circuit device of claim 19 further comprising first and second filter capacitors respectively coupling said first and second signal lines to a reference voltage line.

* * * * *

UNITED STATES PATENT AND TRADEMARK OFFICE
CERTIFICATE OF CORRECTION

PATENT NO. : 7,463,054 B1
APPLICATION NO. : 11/854422
DATED : December 9, 2008
INVENTOR(S) : Kim C. Hardee and Michael C. Parris It is certified that error appears in the above-identified patent and that said Letters Patent is hereby corrected as shown below:

On the Title Page:

Item (75) Inventors: "Michael C. Parris, Colorado Springs, CO (US); Kim C. Hardee, Colorado Springs, CO (US)"

should be: --Kim C. Hardee, Colorado Springs, CO (US); Michael C. Parris, Colorado Springs, CO (US)--

Signed and Sealed this

Twenty-eighth Day of September, 2010

David J. Kappos
*Director of the United States Patent and Trademark Office*